(12) United States Patent
Diao et al.

(10) Patent No.: US 7,851,840 B2
(45) Date of Patent: Dec. 14, 2010

(54) DEVICES AND CIRCUITS BASED ON MAGNETIC TUNNEL JUNCTIONS UTILIZING A MULTILAYER BARRIER

(75) Inventors: Zhitao Diao, Fremont, CA (US); Yiming Huai, Pleasanton, CA (US)

(73) Assignee: Grandis Inc., Milpitas, CA (US)

( * ) Notice: Subject to any disclaimer, the term of this patent is extended or adjusted under 35 U.S.C. 154(b) by 891 days.

(21) Appl. No.: 11/520,868

(22) Filed: Sep. 13, 2006

(65) Prior Publication Data

US 2008/0061388 A1 Mar. 13, 2008

(51) Int. Cl.
*H01L 29/96* (2006.01)
*H01L 43/08* (2006.01)

(52) U.S. Cl. ........... 257/295; 257/9; 257/E29.167; 257/E43.004

(58) Field of Classification Search ........... 257/252, 257/421–427, E21.665, E29.323, E43.004, 257/9, 295, E29.167
See application file for complete search history.

(56) References Cited

U.S. PATENT DOCUMENTS

| | | | |
|---|---|---|---|
| 5,695,864 A | 12/1997 | Slonczewski | |
| 6,137,662 A | 10/2000 | Huai et al. | |
| 6,146,775 A | 11/2000 | Fujita et al. | |
| 6,172,904 B1 | 1/2001 | Anthony et al. | |
| 6,175,476 B1 | 1/2001 | Huai et al. | |
| 6,211,090 B1 | 4/2001 | Durlam et al. | |
| 6,222,707 B1 | 4/2001 | Huai et al. | |
| 6,266,218 B1 | 7/2001 | Carey et al. | |
| 6,347,049 B1 * | 2/2002 | Childress et al. | 365/173 |
| 6,351,355 B1 | 2/2002 | Min et al. | |
| 6,351,409 B1 | 2/2002 | Rizzo et al. | |
| 6,381,105 B1 | 4/2002 | Huai et al. | |
| 6,438,026 B2 | 8/2002 | Gillies et al. | |
| 6,447,935 B1 | 9/2002 | Zhang et al. | |
| 6,518,071 B1 | 2/2003 | Durlam et al. | |
| 6,545,906 B1 | 4/2003 | Savtchenko et al. | |
| 6,603,677 B2 | 8/2003 | Redon et al. | |
| 6,633,498 B1 | 10/2003 | Engel et al. | |
| 6,649,960 B1 | 11/2003 | Cross | |
| 6,687,098 B1 | 2/2004 | Huai | |
| 6,714,444 B2 | 3/2004 | Huai et al. | |
| 6,771,534 B2 | 8/2004 | Stipe | |

(Continued)

FOREIGN PATENT DOCUMENTS

JP 2006-093432 4/2006

(Continued)

OTHER PUBLICATIONS

Hosomi et al.; "A Novel Nonvolatile Memory with Spin Torque Transfer Magnetization Switching: Spin-RAM"; Dec. 5, 2005; Electron Devices Meeting, 2005. IEDM Technical Digest. IEEE International.; pp. 459-462.*

(Continued)

*Primary Examiner*—Marcos D. Pizarro
(74) *Attorney, Agent, or Firm*—Fish & Richardson P.C.

(57) ABSTRACT

Devices having magnetic or magnetoresistive tunnel junctions (MTJS) have a multilayer insulator barrier layer to produce balanced write switching currents in the device circuitry, or to produce the magnetic devices with balanced critical spin currents required for spin torque transfer induced switching of the magnetization, or both for the MTJs under both the forward and reversed bias directions.

44 Claims, 10 Drawing Sheets

U.S. PATENT DOCUMENTS

| | | |
|---|---|---|
| 6,791,868 B2 | 9/2004 | Gider et al. |
| 6,829,161 B2 | 12/2004 | Huai et al. |
| 6,838,740 B2 | 1/2005 | Huai et al. |
| 6,847,547 B2 | 1/2005 | Albert et al. |
| 6,888,704 B1 | 5/2005 | Diao et al. |
| 6,888,742 B1 | 5/2005 | Nguyen et al. |
| 6,893,741 B2 | 5/2005 | Doerner et al. |
| 6,920,063 B2 | 7/2005 | Huai et al. |
| 6,933,155 B2 | 8/2005 | Albert et al. |
| 6,950,335 B2 | 9/2005 | Dieny et al. |
| 6,958,927 B1 | 10/2005 | Nguyen et al. |
| 6,967,863 B2 | 11/2005 | Huai |
| 6,979,586 B2 | 12/2005 | Guo et al. |
| 6,985,385 B2 | 1/2006 | Nguyen et al. |
| 6,989,972 B1 | 1/2006 | Stoev et al. |
| 6,992,359 B2 | 1/2006 | Nguyen et al. |
| 7,006,375 B2 | 2/2006 | Covington |
| 7,009,877 B1 | 3/2006 | Huai et al. |
| 7,027,268 B1 | 4/2006 | Zhu et al. |
| 7,057,921 B2 | 6/2006 | Valet |
| 7,088,609 B2 | 8/2006 | Valet |
| 7,098,494 B2 | 8/2006 | Pakala et al. |
| 7,105,372 B2 | 9/2006 | Min et al. |
| 7,106,624 B2 | 9/2006 | Huai et al. |
| 7,110,287 B2 | 9/2006 | Huai et al. |
| 7,224,601 B2 | 5/2007 | Panchula et al. |
| 7,570,463 B2 * | 8/2009 | Parkin .................... 360/324.2 |
| 2002/0015823 A1 | 2/2002 | Mauler et al. |
| 2002/0105827 A1 | 8/2002 | Redon et al. |
| 2003/0222322 A1 | 12/2003 | Park |
| 2004/0125649 A1 * | 7/2004 | Durlam et al. .............. 365/158 |
| 2004/0130936 A1 | 7/2004 | Nguyen et al. |
| 2004/0136231 A1 | 7/2004 | Huai et al. |
| 2004/0170055 A1 | 9/2004 | Albert et al. |
| 2004/0235201 A1 | 11/2004 | Albert et al. |
| 2005/0041342 A1 | 2/2005 | Huai et al. |
| 2005/0063222 A1 | 3/2005 | Huai et al. |
| 2005/0093092 A1 * | 5/2005 | Tran et al. ................... 257/530 |
| 2005/0106810 A1 | 5/2005 | Pakala et al. |
| 2005/0136600 A1 | 6/2005 | Huai |
| 2005/0184839 A1 | 8/2005 | Nguyen et al. |
| 2005/0237787 A1 | 10/2005 | Huai et al. |
| 2005/0254286 A1 | 11/2005 | Valet |
| 2005/0254287 A1 | 11/2005 | Valet |
| 2006/0018057 A1 | 1/2006 | Huai et al. |
| 2006/0049472 A1 | 3/2006 | Diao et al. |
| 2006/0081953 A1 | 4/2006 | Nguyen et al. |
| 2006/0102969 A1 | 5/2006 | Huai et al. |
| 2006/0114618 A1 | 6/2006 | Hosomi et al. |
| 2006/0141640 A1 | 6/2006 | Huai et al. |
| 2006/0192237 A1 | 8/2006 | Huai |
| 2006/0221676 A1 | 10/2006 | Qian et al. |
| 2006/0281258 A1 | 12/2006 | Dieny et al. |
| 2007/0063236 A1 | 3/2007 | Huai et al. |
| 2007/0063237 A1 | 3/2007 | Huai et al. |
| 2007/0171694 A1 | 7/2007 | Huai et al. |

FOREIGN PATENT DOCUMENTS

| | | |
|---|---|---|
| WO | WO2007/035786 | 3/2007 |
| WO | WO2007/075889 | 7/2007 |

OTHER PUBLICATIONS

Cowache et al., "Spin-valve structures with NiO pinning layers," IEEE Transactions on Magnetics, vol. 34, Iss. 4, part 1, (Jul. 1998) [abstract only].

Dokupil et al., Magnetostriction in combination with GMR/TMR-structures [online] Jun. 2, 2005, [retrieved pn Sep. 5, 2007] <URL: http://www.science24.com/paper/3919 >[abstract only].

Tulapurkar, et al., "Subnanosecond magnetization reversal in magnetic nanopillars by spin angular momentum transfer", *Applied Physics Letters*, vol. 85, No. 22, pp. 5358-5360, Nov. 29, 2004.

Cowburn et al., "Lateral interface anisotropy in nanomagnets," Journal of Applied Physics, 87(9): 7067-7069 (May 1, 2000).

Inomata et al., "Size-independent spin switching field using synthetic antiferromagnets," Applied Physics Letters 82(16): 2667-2669 (Apr. 21, 2003).

Leighton et al., "Coercivity Enhancement in Exchange Biased Systems Driven by Interfacial Magnetic Frustration," Physical Review Letters 84(15): 3466-3469 (Apr. 10, 2000).

Albert, F.J. et al., "Spin-polarized Current Switching of a Co Thin Film Nanomagnet," Appl. Phys. Lett., vol. 77, No. 23, p. 3809-3811 (2000).

Berger, L., "Emission of Spin Waves by a Magnetic Multilayer Traversed by a Current," Phys. Rev. B, vol. 54, p. 9353 (1996).

Devolder, T. et al., "Instability threshold versus switching threshold in spin-transfer-induced magnetization switching", Physical Review B71, 184401-1-184401-6 (2005).

Doi, et al., "Magnetism of $Co_{1-x}Fe_x$-NOL in Specular Spin-Valves", *IEEE Transactions on Magnetics*, vol. 40, No. 4, pp. 2263-2265, Jul. 2004.

Mancoff, F.B. et al., "Phase-locking in double-point-contact spin-transfer devices", Nature, vol. 437:393-395 (2005).

Sharrock, M.P. et al., "Kinetic Effects in Coercivity Measurements", IEEE Transactions on Magnetics, vol. Mag-17, No. 6:3020-3022 (1981).

J. C. Slonczewski, "Current-driven Excitation of Magnetic Multilayers," Journal of Magnetism and Magnetic Materials, vol. 159, p. L1-L5 (1996).

Thirion, C. et al., "Switching of magnetization by nonlinear resonance studied in single nanoparticles", Nature Publishing Group, www.nature.com/naturematerials, vol. 2, 524-527 (2003).

Xi, Haiwen et al., "Spin-current effect on ferromagnetic resonance in patterned magnetic thin film structures", J of Applied Physics 97, 033904 (2005).

Zhang, et al., "40% tunneling magnetoresistance after anneal at 380 C for tunnel junctions with iron-oxide interface layers", *Journal of Applied Physics*, vol. 89, No. 11, pp. 6665-6667, Jun. 1, 2001.

\* cited by examiner

Bias dependence of resistance

FIG. 6B

Bias dependence of TMR

DEVICES AND CIRCUITS BASED ON MAGNETIC TUNNEL JUNCTIONS UTILIZING A MULTILAYER BARRIER

BACKGROUND

This application relates to devices and circuits based on magnetic tunnel junctions, including magnetic memory devices having magnetic tunnel junction cells that can be switched using a spin transfer torque effect.

A magnetic or magnetoresistive tunnel junction (MTJ) can include at least three layers: two ferromagnetic layers and a thin layer of a non-magnetic insulator as a barrier layer between the two ferromagnetic layers. The insulator material for the middle barrier layer is not electrically conductive and hence functions as a barrier between the two ferromagnetic layers. When the thickness of the insulator is sufficiently thin, e.g., a few nanometers or less, electrons in the two ferromagnetic layers can "penetrate" through the thin layer of the insulator due to a tunneling effect under a bias voltage applied to the two ferromagnetic layers across the barrier layer. The resistance to the electrical current across the MTJ structure varies with the relative direction of the magnetizations in the two ferromagnetic layers. When the magnetizations of the two ferromagnetic layers are parallel to each other in a parallel state (P), the resistance across the MTJ structure is at a minimum value $R_P$. When the magnetizations of the two ferromagnetic layers are opposite to or anti-parallel with each other in an anti-parallel state (AP), the resistance across the MTJ is at a maximum value $R_{AP}$. The magnitude of this effect can be characterized by a tunneling magnetoresistance (TMR) defined as $(R_{AP}-R_P)/R_P$.

The relationship between the resistance to the current flowing across the MTJ and the relative magnetic direction between the two ferromagnetic layers in the TMR effect can be used for various applications including nonvolatile magnetic memory devices to store information in the magnetic state of the MTJ. Magnetic random access memory (MRAM) and other magnetic memory devices based on the TMR effect, for example, may be an alternative to and compete with electronic RAM devices in various applications. In such magnetic memory devices, one ferromagnetic layer is configured to have a fixed magnetic direction and the other ferromagnetic layer is a "free" layer whose magnetic direction can be changed to be either parallel or opposite to the fixed direction. Information is stored based on the relative magnetic direction of the two ferromagnetic layers on two sides of the barrier of the MTJ. For example, binary bits "1" and "0" may be recorded as the parallel (P) and anti-parallel (AP) orientations of the two ferromagnetic layers in the MTJ. Recording or writing a bit in the MTJ can be achieved by switching the magnetization direction of the free layer by, e.g., applying a writing magnetic field to the free layer or driving a current flowing across the MTJ based on the spin torque transfer effect.

The current switching based on the spin transfer effect may be used for high-density magnetic memory devices in part because the current required for current induced switching of the magnetization of the recording layers has been steadily decreasing as the device density grows following the scaling down rule compatible to semiconductor or CMOS technology evolution. The threshold of the spin-transfer switching current density Jc is now achievable at about $10^6$ A/cm$^2$ and can continue to decrease. This reduction of the spin-transfer switching current density Jc can lead to lower power consumption and smaller dimensions for the isolation transistor used in current switching MTJ-based MRAM devices. The current required for changing the magnetization of the free layer for recording data can be as small as 0.1 mA and is much lower than the current typically used for producing the switching magnetic field in the magnetic field switching MTJ. In addition, the degree of integration for MTJ cells can be approximately equal to that of DRAM cells and the write and readout times are expected to be comparable to those of SRAM cells.

Therefore, the MTJ cells based on the spin torque transfer switching can be used in high density memory devices and other applications.

SUMMARY

This specification describes, among others, techniques and devices that use two or more different insulator barrier layers in a magnetoresistive tunnel junction (MTJ). The two or more insulator barrier layers can be configured to provide balanced write currents flowing in opposite directions across the MTJ in a memory circuitry. In one aspect, a device is described to include a magnetoresistive tunnel junction (MTJ) which includes a free ferromagnetic layer having a magnetization direction that is changeable, a pinned ferromagnetic layer having a magnetization direction fixed along a predetermined direction; and an insulator barrier structure between the free and pinned ferromagnetic layers. The insulator barrier structure includes at least first and second insulator barrier layers that have different dielectric constants.

In another aspect, this specification describes a device that includes a magnetoresistive tunnel junction (MTJ) including a free ferromagnetic layer having a magnetization direction that is changeable, a pinned ferromagnetic layer having a magnetization direction fixed along a predetermined direction, and an insulator barrier structure between the free and pinned ferromagnetic layers. The insulator barrier structure includes at least first and second insulator barrier layers that have different electrical barrier energies to provide different electrical properties when two opposite electrical bias voltages are applied between the free ferromagnetic layer and the pinned ferromagnetic layer.

In yet another aspect, a method is described to provide a control circuit for a magnetoresistive tunnel junction (MTJ) to apply a forward electrical bias or a reversed electrical bias across the MTJ to effectuate a switching of a magnetization direction in the MTJ via a spin torque transfer effect. The control circuit has an electrical asymmetry in applying the forward electrical bias and the reversed electrical bias. A multilayer structure is provided as the MTJ to include a free ferromagnetic layer having a magnetization direction that is changeable, a pinned ferromagnetic layer having a magnetization direction fixed along a predetermined direction, and an insulator barrier structure between the free and pinned ferromagnetic layers. The insulator barrier structure includes at least first and second insulator barrier layers that have different electrical properties of the MTJ under the forward electrical bias and the reversed electrical bias to negate the electrical asymmetry of the control circuit in applying the forward electrical bias and the reversed electrical bias at the bi-layer MTJ.

The details of one or more embodiments of the subject matter described in this specification are set forth in the accompanying drawings and the description below. Other

DETAILED DESCRIPTION

Figure 1:
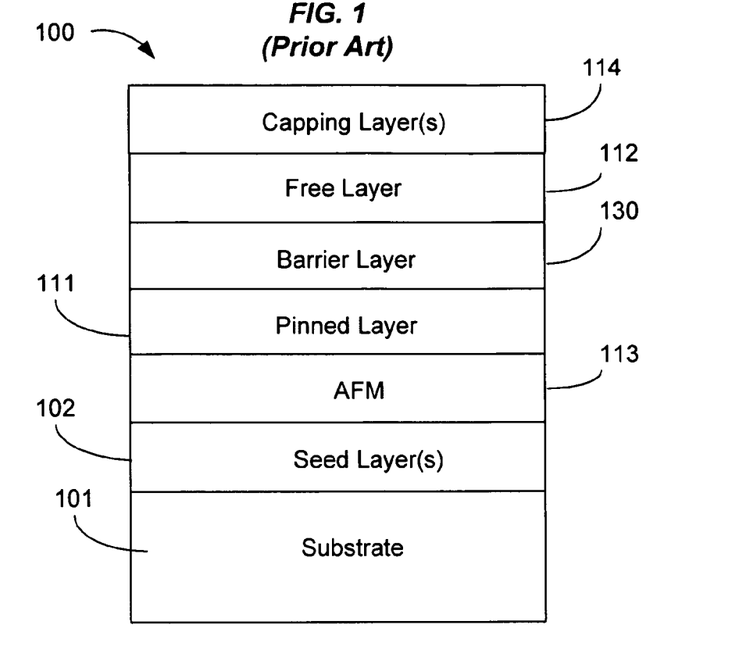
FIG. 1 shows one example of a typical MTJ cell having a single insulator barrier layer of a single insulator material.

FIG. 1 illustrates an example of a typical MTJ 100. The MTJ is formed on a substrate 101 of a suitable material such as a Si substrate. The MTJ 100 is constructed on one or more seed layers 102 directly formed on the substrate 101. Over the seed layers 102, an antiferromagnetic (AFM) layer 113, e.g., a layer of PtMn and IrMn, is first formed and then a first ferromagnetic layer 111 is formed on top of the AFM layer 113. After the post annealing, the ferromagnetic layer 111 is then pinned with a fixed magnetization. On top of the first ferromagnetic layer 111 is a thin insulator barrier layer 130 such as a metal oxide layer. In most MTJ designs, this insulator barrier layer 130 is made of a single material. A second ferromagnetic layer 112 is formed directly on top of the barrier layer 130. In addition, at least one capping layer 114 is formed on top of the second ferromagnetic layer 112 to insulate the MTJ from being exposed to the exterior environment and hence to protect the MTJ.

The magnetization of the ferromagnetic layer 112 is not pinned and can be freely changed to be either parallel (P) to or anti-parallel (AP) to the fixed magnetization of the pinned layer 111. For this reason, the ferromagnetic layer 112 is a free layer (FL) and has its magnetic easy axis substantially along the fixed magnetization direction of the pinned layer 111 and its magnetically hard axis substantially perpendicular to the easy axis. The control of the magnetization of the ferromagnetic layer 112 can be through an external write magnetic field in a field switching design, or a write current perpendicularly flowing through the MTJ in a spin torque transfer switching design. A magnetic field in the field operating range, or an applied current across the junction in the current operating range, can force the magnetization of the free layer 112 to be substantially parallel to or substantially opposite to the fixed magnetization of the pinned layer 111. Typical magnetic systems have competing energy contributions that prevent a perfect parallel or antiparallel alignment of the magnetic domains or nanomagnets in each ferromagnetic layer. In MTJS, the dominant contribution to the energy state of the nanomagnets within the free layer 112 tends to force the nanomagnets into the parallel or antiparallel alignment, thus producing a substantial parallel or antiparallel alignment. In an actual device, each cell may be elliptically shaped and elongated to provide the shape anisotropy in the magnetic recording layer of the MTJ cell to spatially favor a particular magnetization direction as the easy axis in order to increase the stability of the MTJ cell against perturbations to the magnetization of the MTJ cell, e.g., thermal fluctuation.

The MTJ 100 in FIG. 1 can be electrically biased in a forward bias configuration and in a reversed bias configuration. In the forward bias configuration, the electrical potential applied to the free layer 112 is higher than that at the pinned layer 111 so that the driving current flows from the free layer 112 to the pinned layer 111 across the junction. Electrons are driven across the junction from the pinned layer 111 to the free layer 112. In the reversed bias configuration, the electrical potential applied to the free layer 112 is lower than that at the pinned layer 111 so that the electrons are driven from the free layer 112 to the pinned layer 111 across the junction.

Figure 2A:
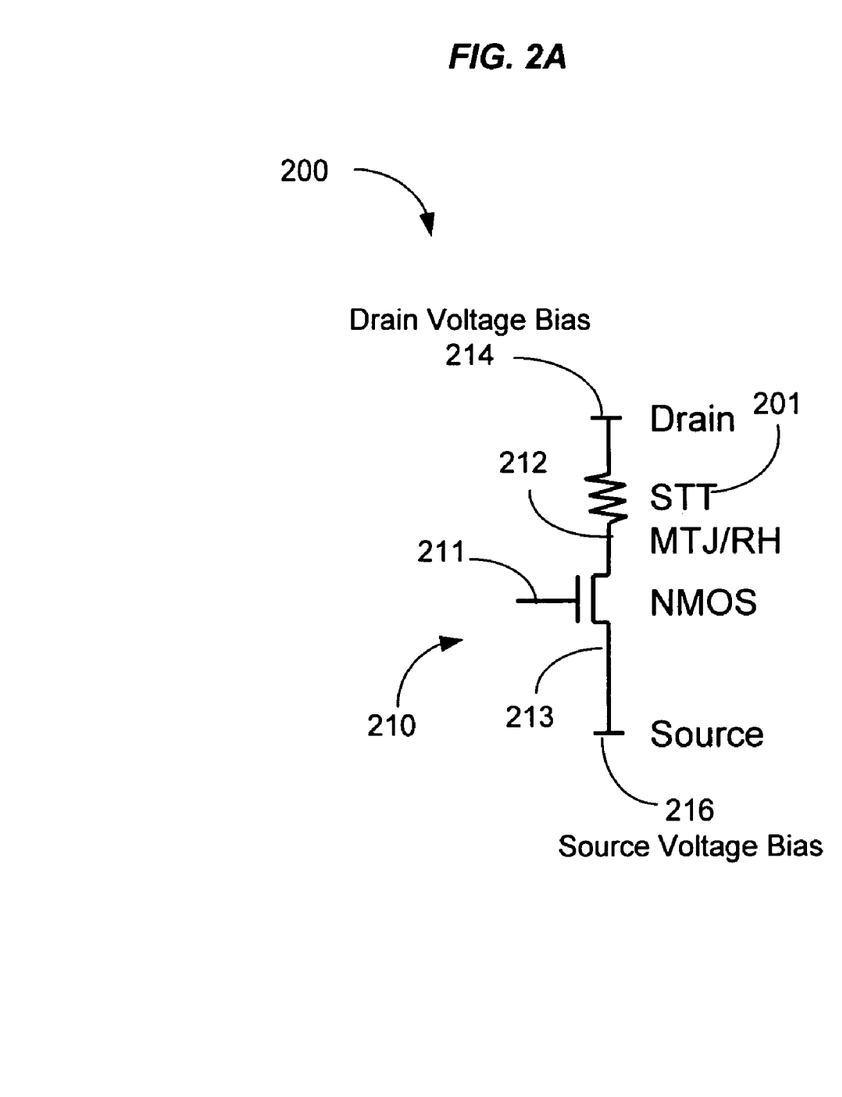
FIG. 2A shows an example MTJ circuit based on the spin transfer effect where the MTJ cell is connected to a single transistor to control a driving current applied to the MTJ cell.
Figure 2B:
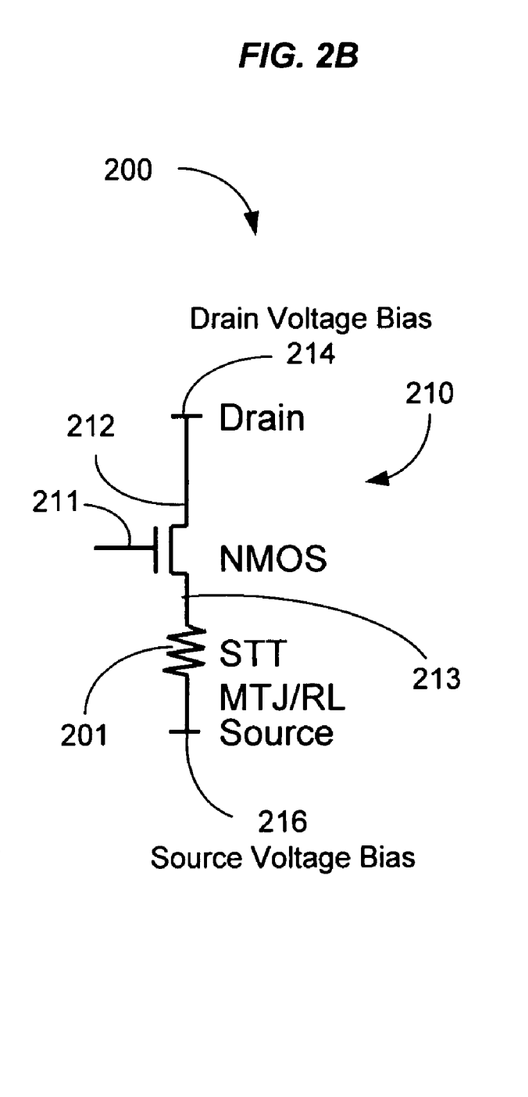
FIG. 2B shows an equivalent circuit for the example MTJ circuit in FIG. 2A when the driving current direction is reversed.

FIGS. 2A and 2B show equivalent circuits for an example memory cell circuit 200 using an MTJ based on the spin torque transfer (STT) effect where the MTJ cell is connected to a single transistor under the forward and reversed bias conditions. In this circuit 200, a single select transistor 210 with a gate 211, a drain 212 and a source 213 is used to control the driving current in a MTJ cell 201 which switches its magnetization direction based on the spin torque transfer (STT) effectuated by the driving current. This memory cell circuit 200 is known as a single select transistor per MTJ cell design (1T1MTJ). Drain voltage bias node 214 and source voltage bias node 216 are used to apply bias voltages to the drain 212 and the source 213, respectively. The MTJ cell 201 is connected between the drain voltage bias node 214 and the drain terminal 212 of the transistor 210. For example, for the MTJ cell 201 under the design in FIG. 1, the free layer 112 is electrically connected to the drain voltage bias node 214 and the pinned layer 111 is electrically connected to the drain terminal 212 of the select transistor 210. The MTJ cell 201 is electrically biased in the forward direction when the voltage at the voltage bias node 214 is higher than the voltage at the voltage bias node 216 and is electrically biased in the reversed direction when the voltage at the voltage bias node 214 is lower than the voltage at the voltage bias node 216.

A control circuit is electrically coupled to the circuit 200 to control the bias voltages at the nodes 214 and 216 to apply the driving current through the MTJ cell 201 in either the forward direction in FIG. 2A when the source terminal 213 of the select transistor is grounded and the bias node 214 is set at a positive voltage or the reversed direction in FIG. 2B when the drain terminal 212 is grounded and the bias node 216 is set a positive voltage. These two different electrical configurations of the 1T1MTJ circuit 200 are not symmetrical. The MTJ cell 100 in FIG. 1 is, however, electrically symmetric in both bias directions when the top and bottom electrodes are identically or similarly structured. Therefore, the asymmetry in the circuit electrical configurations in the forward and reversed bias directions for the 1T1MTJ circuit 200 in FIGS. 2A and 2B causes a difference in the output current in the two circuit configurations. Such asymmetry of the cell circuitry can complicate the operation of the MTJ cell 100 and compromise or degrade the performance of devices using such MTJ structures.

Figure 3A:
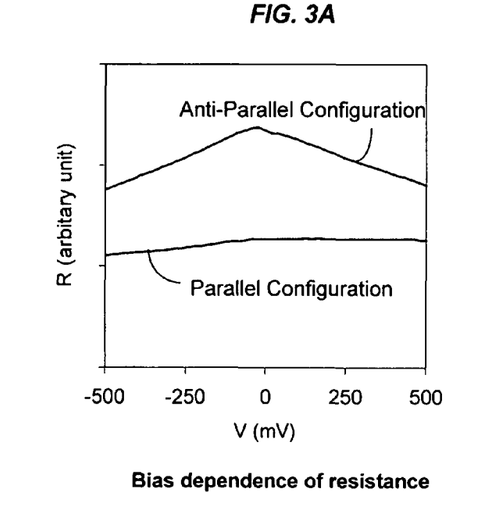
FIGS. 3A and 3B show MTJ properties of an example MTJ cell with respect to the voltage bias applied across the MTJ cell.
Figure 3B:
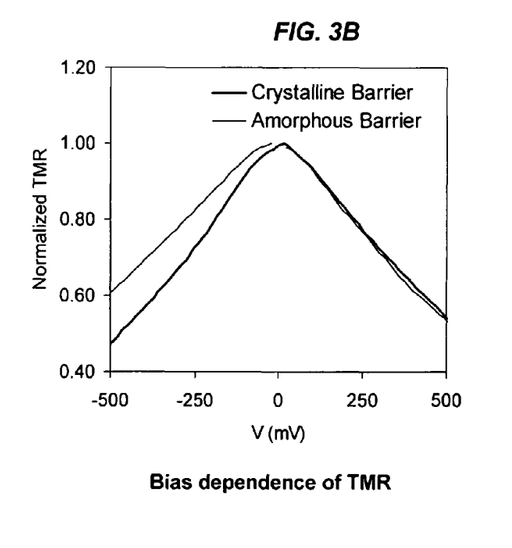

FIGS. 3A and 3B show examples of dependencies of the MTJ resistance R and tunneling magnetoresistance (TMR) on the voltage bias applied across an MTJ cell based on the design in FIG. 1. In general, MTJ cells based on the design in FIG. 1 having identically or similarly structured top and bottom electrodes exhibit bias dependences that are approximately symmetric with respect to the bias applied. FIG. 3A shows the MTJ resistance R at the parallel (P) direction shown in the bottom curve and anti-parallel (AP) direction shown in the top curve as a function of the bias voltage V for an MTJ cell with an amorphous barrier $Al_2O_3$ based on the design in FIG. 1. The MTJ resistance R is approximately symmetric for the forward (V>0) and reversed (V<0) bias voltages. MTJ cell structures based on the design in. FIG. 1 may use either amorphous barriers such as $Al_2O_3$ or crystalline barriers such as MgO crystalline materials.

FIG. 3B shows the bias dependences of the TMR for either amorphous barriers such as $Al_2O_3$ or for crystalline barriers such as MgO. The TMR values exhibit approximately symmetric variation as a function of the bias voltage applied, in particular for amorphous barriers, when the top and bottom electrodes are designed similarly. For MTJs based on the design in FIG. 1, an MTJ with a crystalline barrier shows more pronounced bias dependence in the reversed bias direction than a MTJ with an amorphous barrier when other device parameters are identical or similar. In general, MTJ cells based on the design in FIG. 1 having identically or similarly structured top and bottom electrodes exhibit approximately symmetric bias dependences with respect to the bias applied and thus tend to behave differently when the MTJ circuit is asymmetric in the forward and reversed configurations.

Figure 4:
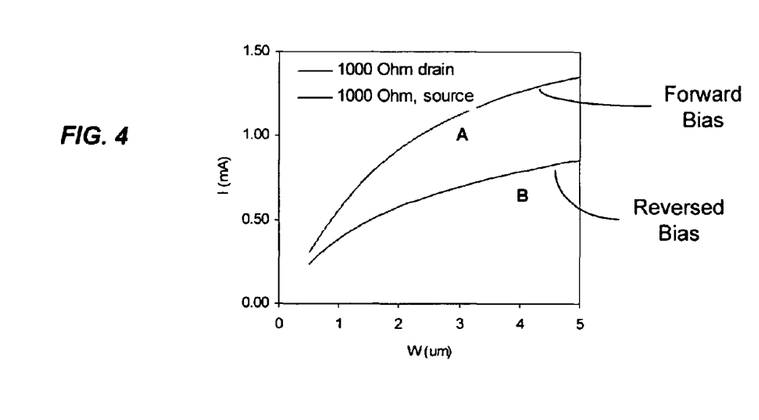
FIG. 4 shows the saturated currents from the transistor to the MTJ cell of FIG. 1 under the two bias directions as a function of the gate width of the transistor that operates the MTJ cell.

FIG. 4 further shows the currents across the MTJ cell 201 based on the design in FIG. 1 connected in the 1T1MTJ memory cell circuit 200 in FIGS. 2A and 2B under the forward (A) and reversed (B) bias configurations as a function of the gate width (W) of the select transistor 210. The currents in the forward and reversed directions are different at a given transistor width and their differences vary with the transistor width. In programming a bit using spin transfer induced magnetization switching scheme, a write current is applied in the forward direction to record a "0" bit and in the reversed direction to record a "1" bit. The currents generated by the select transistor 210 in the forward and reversed directions are different for a given transistor gate width due to the asymmetry of the transistor circuit, wherein the resistance R of the MTJ essentially remains the same under the two opposite directions of the electrical bias across the MTJ. In a practical device cell, the resistance of the MTJ may change based on the TMR ratio of the MTJ cell as shown in FIGS. 3A and 3B. However, the asymmetry from the circuit still exists and leads to the asymmetry in the driving current. This asymmetry complicates the control and operations of the 1T1MTJ memory circuit and can be compensated either electronically in the driving circuitry or structurally in designing the MTJ cells.

Figure 5:
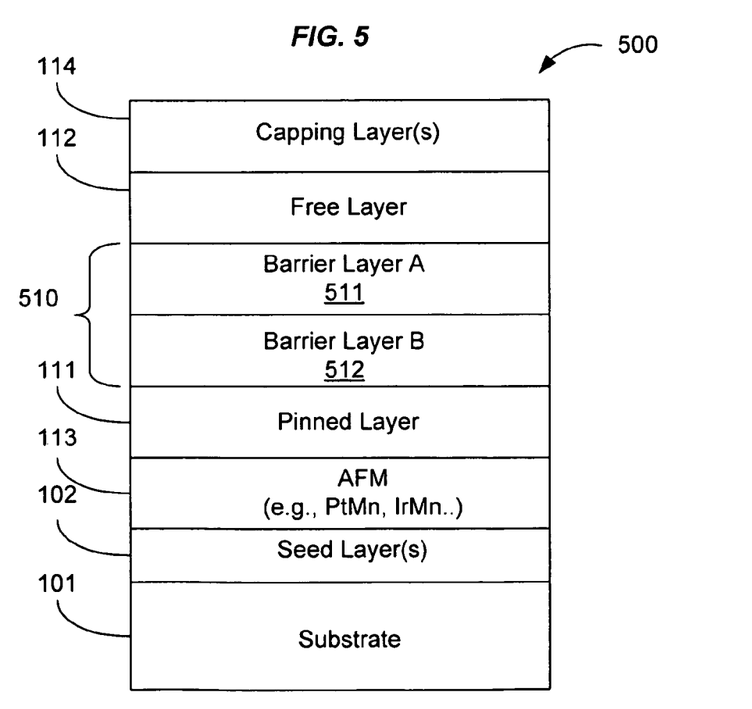
FIG. 5 shows an exemplary MTJ cell with a bi-layer insulator barrier.

One way to mitigate the asymmetric behaviors of the 1T1MTJ circuitry is to structurally alter the electronically symmetric structure with the free layer, the barrier and the pinned layer of the MTJ design in FIG. 1 and to provide an MTJ structure that is electrically asymmetric in a way that negates the asymmetric behaviors of the 1T1MTJ circuitry. FIG. 5 shows one example of a MTJ 500 that includes two different insulator barrier layers 511 and 512 as the barrier layer 510 between the free layer 112 and the pinned layer 111 to break the symmetry in the MTJ design in FIG. 1.

In FIG. 5, the barrier layer 510 includes two or more different insulator barrier layers that are electronically different from one another (e.g., dielectric constants) to create asymmetry in the MTJ resistance R in the forward and reversed directions. At least one of the different insulator barrier layers can be made of an amorphous material or a crystalline material. As an example, the barrier layer 510 is shown as a bi-layer having two different insulator barrier layers 511 and 512. In one implementation, for example, the two insulator barrier layers 511 and 512 can be of the same thickness but have different dielectric constants. More specifically, the dielectric constant of the insulator barrier 512 on the side of the MTJ with the pinned layer 111 is larger than that of the insulator barrier layer 511 on the other side of the MTJ 500. Hence, when connected in an 1T1MTJ circuitry such as the circuit in FIGS. 2A and 2B, a larger portion of the bias voltage is applied to the insulator barrier layer 511 adjacent to the free layer 112 and the insulator barrier layer 512 adjacent to the pinned layer 111 functions as a flat barrier under both forward and reversed biases. Both of the insulator barrier layers 511 and 512 can be made of amorphous materials in some implementations and crystalline materials in other implementations. The differences in the insulator barrier layers 511 and 512 can be designed to produce an asymmetry which negates the asymmetry in the forward and reversed bias configurations of the 1T1MTJ circuit in FIGS. 2A and 2B.

Figure 6A:
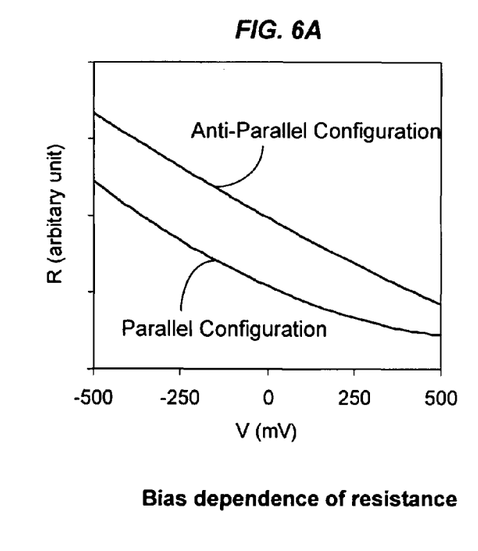
FIGS. 6A and 6B show typical device properties of the MTJ cell in FIG. 5.
Figure 6B:
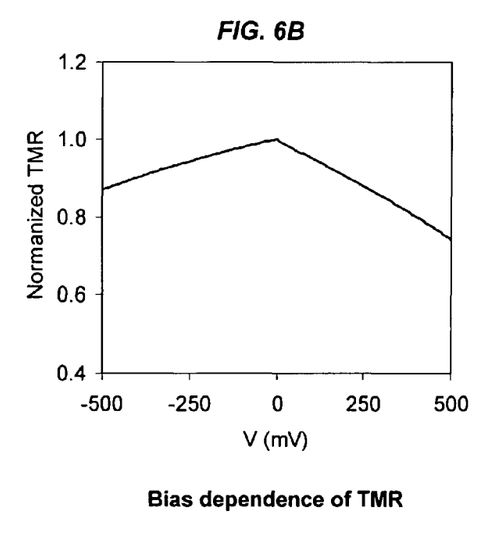

FIGS. 6A and 6B show the MTJ resistance R and the TMR as a function of the voltage bias applied across the MTJ cell 500 in FIG. 5. Different from the symmetric MTJ design in FIG. 1, the built-in difference between the insulator barrier layers 511 and 512 in the design in FIG. 5 creates an asymmetry in the MTJ. FIG. 6A shows the MTJ resistance R in the parallel (P) alignment or state and anti-parallel (AP) alignment or state between the free layer 112 and pinned layer 111. The MTJ tunnel current exhibits a positive dependence on the forward bias voltage, i.e., increases in magnitude with the magnitude of the applied voltage, and a negative dependence on the reversed bias voltage, i.e., decreases in magnitude with the magnitude of the applied voltage. As shown in FIG. 6A, the bias dependence of the MTJ resistance R for the MTJ 500 with a bi-layer barrier in FIG. 5 is nearly a monotonic function of the bias voltage in the range from −500 V to +500 V in which the MTJ resistance R nearly monotonically decreases as the bias voltage changes from −500 V to +500 V. This asymmetric dependence on the bias voltage of the MTJ resistance R in the MTJ 500 with a bi-layer barrier in FIG. 5 is very different from the approximate symmetric dependence of the MTJ 100 with a single-layer barrier in FIG. 1. Notably, the behaviors of the MTJ resistance R of the MTJ 500 in FIG. 5 and the MTJ 100 in FIG. 1 are different when the bias is negative. In implementations, the two barrier layers 511 and 512 may be equal in thickness and have different barrier heights with an approximate barrier height ratio $E_A/E_B$ of 2 above the Fermi energy.

FIG. 6B shows the dependence of TMR on the bias voltage on the MTJ 500 in FIG. 5. The bias dependence of the TMR in the MTJ 500 with a bi-layer barrier in FIG. 5 is significantly reduced at the reverse bias in comparison with bias dependence of TMR for the MTJ 100 with a single-layer barrier in FIG. 1. At small bias voltages near 0, the difference between the TMR values under the forward bias and the reversed bias is small and this feature benefits reading scheme. The bi-layer insulator barrier 510 in FIG. 5 allows electrons to experience different effective barrier heights in the insulator 511 under the forward and reversed bias such that the tunnel current and MTJ resistance are different. The tunnel current and MTJ resistance are modified by the bi-layer configuration such that the bi-barrier MTJ 500 has an asymmetrical spin polarized tunnel effect under the forward and reversed biases. The thickness and barrier height of both barriers can be set properly to assure that the asymmetry of tunneling and the modulation of the alignment of magnetic layers on tunneling can match each other.

In implementing the bi-layer barrier layer 510 in FIG. 5, the parameters of the bi-layer barrier 510 can be selected to adjust the resistance of the MTJ when the polarizations of the free layer 112 and the pinned layer 111 are parallel at a range of values which can change significantly, e.g., by a percentage change from 50% to 100% at both bias points corresponding to switching from the parallel state to the anti-parallel state (P-AP) and switching from the anti-parallel state to the parallel state (AP-P) of the magnetization of the free layer 112 due to the spin torque transfer effect. This change in resistance is different from that contributes to the TMR but from asymmetric bias dependences of either P-state or AP-state resistance. This adjustability of the MTJ resistance R can be used to compensate for the current asymmetry of the 1T1MTJ circuitry.

Figure 7:
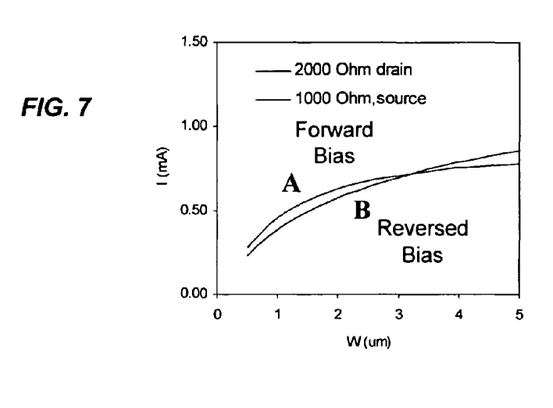
FIG. 7 shows the saturated currents from the transistor to the MTJ cell of FIG. 5 under the two bias directions as a function of the gate width of the transistor that operates the MTJ cell.

FIG. 7 shows the driving currents from the select transistor as a function of the transistor width (W) in both forward bias (A) and reversed bias (B) for the MTJ 500 with a bi-layer barrier in FIG. 5 using the 1T1MTJ circuitry shown in FIGS. 2A and 2B. In operation, the built-in asymmetry in the bi-layer structure of the insulator barrier layer in FIG. 5 negates the asymmetry in the driving current in the forward and reversed bias directions in the 1T1MTJ circuit. As a result, the difference in the currents in the two bias directions is almost eliminated as compared to that in the MTJ 100 with a single-layer barrier in FIG. 1. In addition, in both bias directions, the currents provided by the select transistor vary with the gate width of the select transistor in essentially the same manner in the design in FIG. 5. This is very different from the behavior of the MTJ 100 with a single insulator barrier layer in FIG. 1 as shown in FIG. 4. Therefore, the bi-layer design for the insulator barrier layer can significantly improve the MTJ programming asymmetry as the circuit size reduces.

Figure 8A:
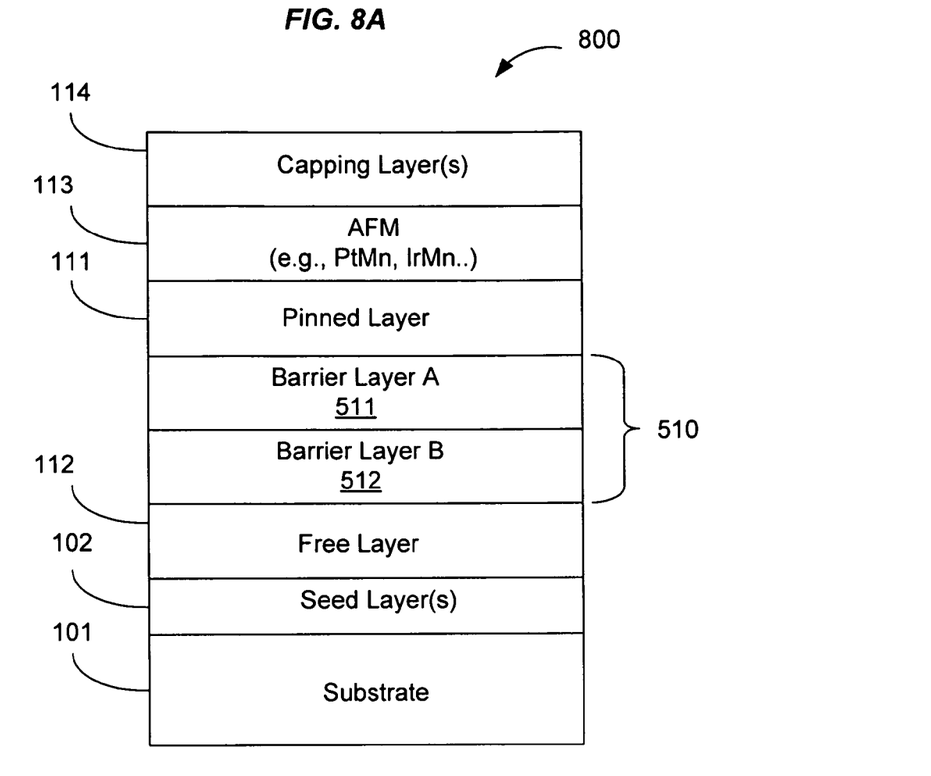
FIG. 8A shows another exemplary MTJ cell with a bi-layer insulator barrier with top pin structure.

The MTJ in FIG. 5 having the bi-layer barrier design can be used to achieve approximately balanced currents in the forward and reversed bias conditions. However, the MTJ in FIG. 5 still exhibits asymmetry in TMR under the forward and reversed bias configurations. When switching from the parallel (P) state to the anti-parallel (AP) state, the MTJ in FIG. 5 is under the forward bias and thus the TMR value is less than the corresponding TMR value when the MTJ is under the reserved bias. FIG. 8A shows a MTJ design 800 with a bi-layer barrier layer 510 in a "top pin" structure where the positions of the free layer 112 and the pinned layer 511 are reversed from the design in FIG. 5. In this MTJ structure, the MTJ is under a reversed bias when switching from the parallel state to the anti-parallel state and thus the TMR is enhanced than the TMR when the MTJ is under the forward bias in switching from the parallel state to the anti-parallel state as in the MTJ design in FIG. 5. As a result, the MTJ 800 in FIG. 8A can reduce the asymmetry in both the circuitry driving currents under two different bias configurations, and the critical STT P-AP switching current for switching from the parallel state to the anti-parallel state that for the write operation due to TMR or spin polarization enhancement at this reversed bias direction.

Figure 8B:
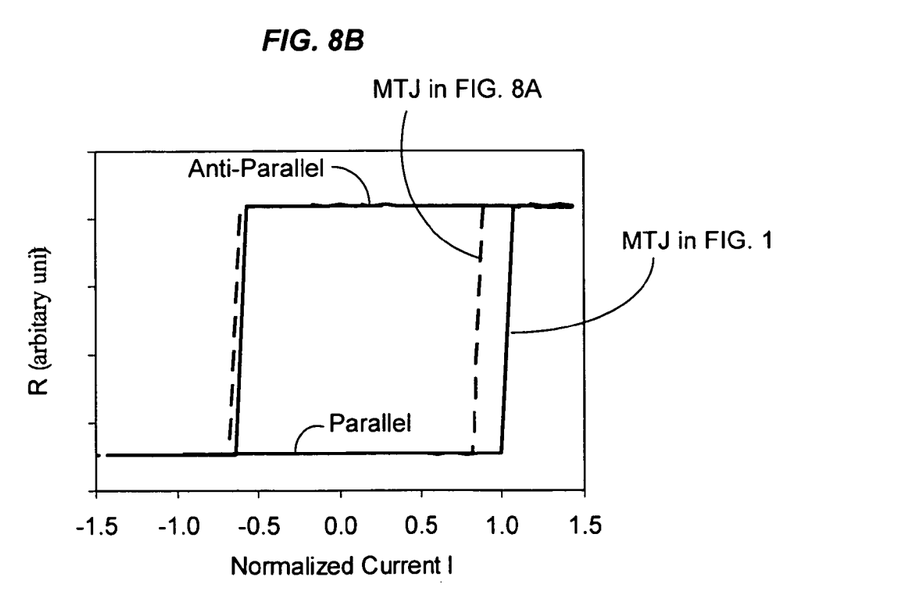
FIG. 8B shows improved symmetry in current of spin torque transfer induced switching of magnetization using the MTJ cell of FIG. 8A, as compared with using the MTJ cells of FIGS. 1 and 5.

FIG. 8B shows the dependence of the MTJ resistance R on the switching current across the MTJ for MTJ cells in FIGS. 1 and 8A. This comparison between the MTJ cells in FIGS. 1 and 8 illustrates the improved performance and reduced asymmetric behaviors in writing data using spin torque transfer. The switching from the parallel state to the anti-parallel state in the MTJ in FIG. 8A requires a less current than that in the MTJ in FIG. 1 for the same write operation because of the enhanced TMR in FIG. 8A. For high performance MTJ cells with a large spin polarized factor, this difference in the switching current for the P-AP switching can be significant in terms of smaller overdrive current required in the device design. Accordingly, a single-barrier MTJ cell based on the design in FIG. 1 may require a significantly higher current to accomplish the P-AP switching than what is needed in the bi-layer MTJ cell in FIG. 8A.

Though in this bias direction for the P-AP switching a larger current is required, a 1T1MTJ circuitry with a conventional single-barrier MTJ, usually generates a smaller current due to the asymmetry of CMOS performance as compared with that in the other bias direction. This mismatch between the STT performance of a magnetic cell and the CMOS characteristics can significantly limit the memory cell efficiency. The requirement for a large driving current suggests that a larger COMS transistor is needed to provide the sufficient current for the bit programming. At the same time, the use of a large CMOS transistor can increase the size of each cell to accommodate for the size of the large transistor and thus can reduce the memory cell density. The use of a bi-barrier MTJ cell provides the unique bias dependence on the reverse bias direction. As a result, the spin polarization factor of the memory cell can be enhanced due to a larger TMR as compared to that for conventional MTJ cells in the same bias direction, so that the current for bit switching in this specified direction is reduced, indicating well-balanced currents in terms of the P-AP switching and the AP-P switching. The reduced switching current allows for a smaller CMOS transistor to be used as the select transistor and thus increases the cell density.

The bi-layer barrier design described above can be used in various implementations to achieve a number of advantages or technical features. For example, the bi-layer barrier can be designed to balance write currents in writing both "0" and "1" data states without creating differences in the writing currents for a well-balanced circuit design. As. described above, circuit asymmetry in CMOS circuitry can occur in MTJ cells with a single insulator barrier layer made of a single insulator material. This circuitry asymmetry leads to unbalanced currents for switching the MTJ under the two different bias directions. Therefore, this unbalance in the currents presents a risk for increasing the current unnecessarily in one bias direction to provide a sufficient current in the other opposite bias direction for writing a bit. This increased current causes an increase in the voltage drop across the MTJ memory cell, and that is undesirable and can adversely affect the reliability of the tunneling barrier of the MTJ cell. The bi-layer barrier design can create a built-in unbalance in the MTJ so that the currents in both bias directions can be well-balanced. From the circuitry design point of view, there is no extra cost at the memory cell density and power dissipation.

As another example, the bi-layer barrier design described above can be used in various implementations to reduce the voltage drop across MTJ cell to achieve better MTJ reliability and endurance. This is a result of the balanced write currents in the MTJ cell in both bias directions. Under a proper bi-layer barrier design, the select transistor or a CMOS for the MTJ cell generates a symmetric current in both current directions and the current can vary only with the CMOS gate width of the transistor manufactured by using a fixed technology node and operated under a fixed applied voltage. This property of the driving current for the MTJ cell can facilitate the memory design with improved reliability by eliminating the possible too large overdrive current in one specified current direction.

In addition, the bi-layer barrier design does not significantly affect the reading of the MTJ cell and the reading signal. In the present bi-layer barrier design, the TMR dependence on the bias is negligibly small at a very small bias range (FIG. 6B). Because the readout of the MTJ cell is carried out under a small voltage bias, the bi-layer barrier design does not impact the read scheme or the reading signal.

In yet another aspect, the bi-layer barrier design described above can be used in various implementations to reduced the unit cell area and thus to achieve a high memory density. A bi-barrier MTJ can produce a large TMR signal, i.e., a larger spin polarized factor at the reverse direction that contributes to reduce asymmetry of spin polarized current needed for a bit switching or to reduce the current required to realize P-AP switching using spin torque transfer. Overall, as a result a smaller current is used irrespective of current direction or configuration of magnetic layers within the bi-barrier MTJ cell. Therefore, the CMOS size can be used with this reduction in the switching current to increase the memory cell density.

Figure 9A:
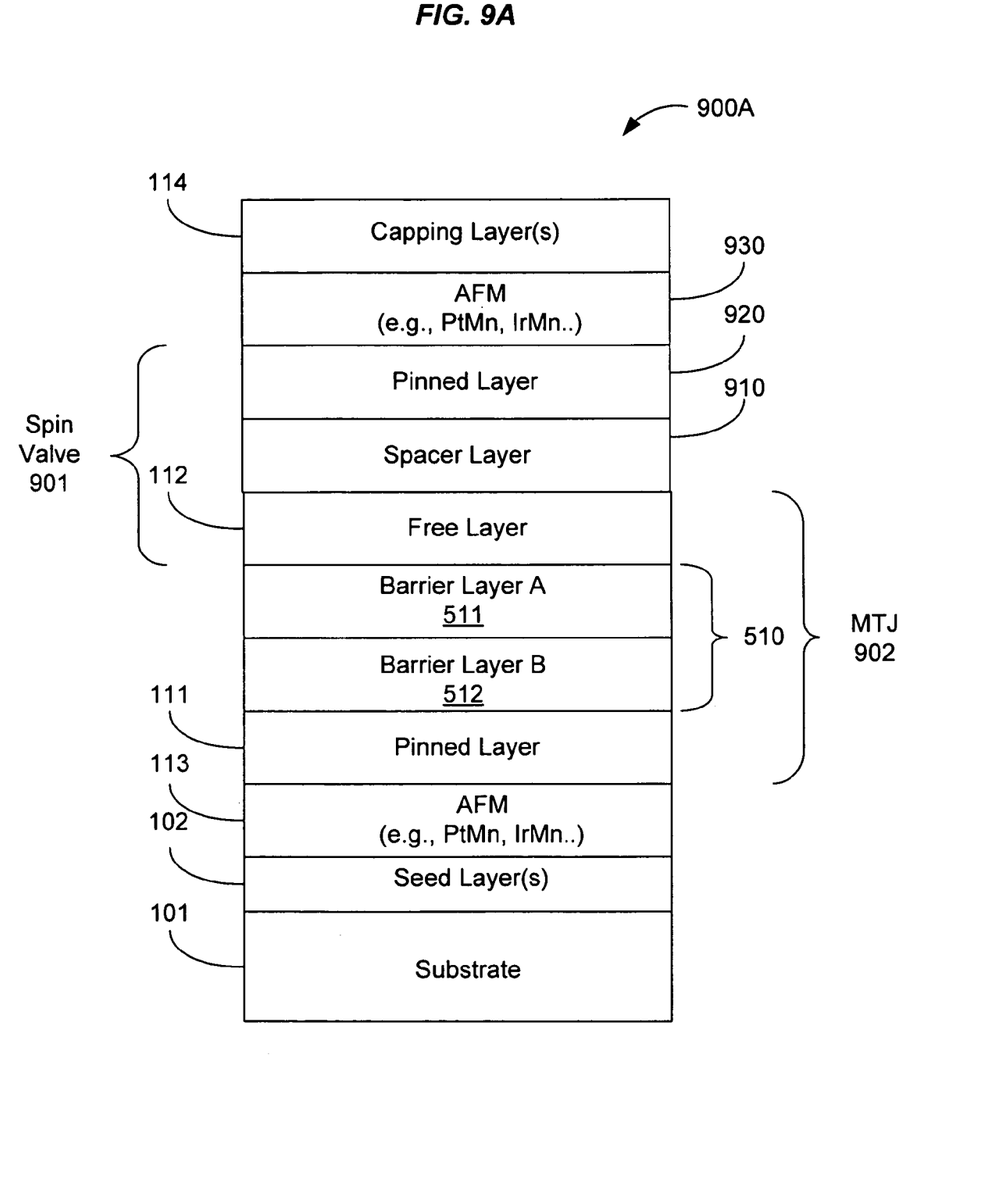
FIG. 9A shows an example of a hybrid MTJ cell structure which stacks a spin valve over an MTJ cell in FIG. 5 with a shared free layer.

FIG. 9A shows a hybrid structure 900A which stacks a spin valve 901 over an MTJ 902 based on the bi-layer barrier design in FIG. 5. Like the design in FIG. 5, this design can reduce the circuitry asymmetry under the two different bias configurations. The lower part of the hybrid structure 900A is the same as the MTJ in FIG. 5. On top of the free layer 122, a spacer layer 910, a second pinned layer 920 and a second anti-ferromagnetic layer 930 are formed to make up the spin valve 901. The spin value 901 and the bottom MTJ share the free layer 112. The spacer layer 910 in the spin valve 901 can include one or more nonmagnetic and electrically conductive spacer layers 610 (e.g., metal layers). The spacer layer 910 can be a single layer of a metal material such as Cu or a composite nonmagnetic conductive structure with multiple layers. This hybrid structure 900 can be operated by the spin-transfer switching operation where the driving current perpendicularly flowing through the structure controls the spin value to change the direction of the magnetization of the free layer. The driving current, in turn, controls the magnetoresistance across the bottom MTJ via control of the free layer 112. In addition, the spacer layer 910 may also be replaced by using an insulator barrier layer to change the spin valve 901 into a second MTJ that is stacked over the bottom MTJ. A single-layer insulator barrier layer may be used in the second MTJ. This design effectuates a serial connection of two MTJ resistors.

Figure 9B:
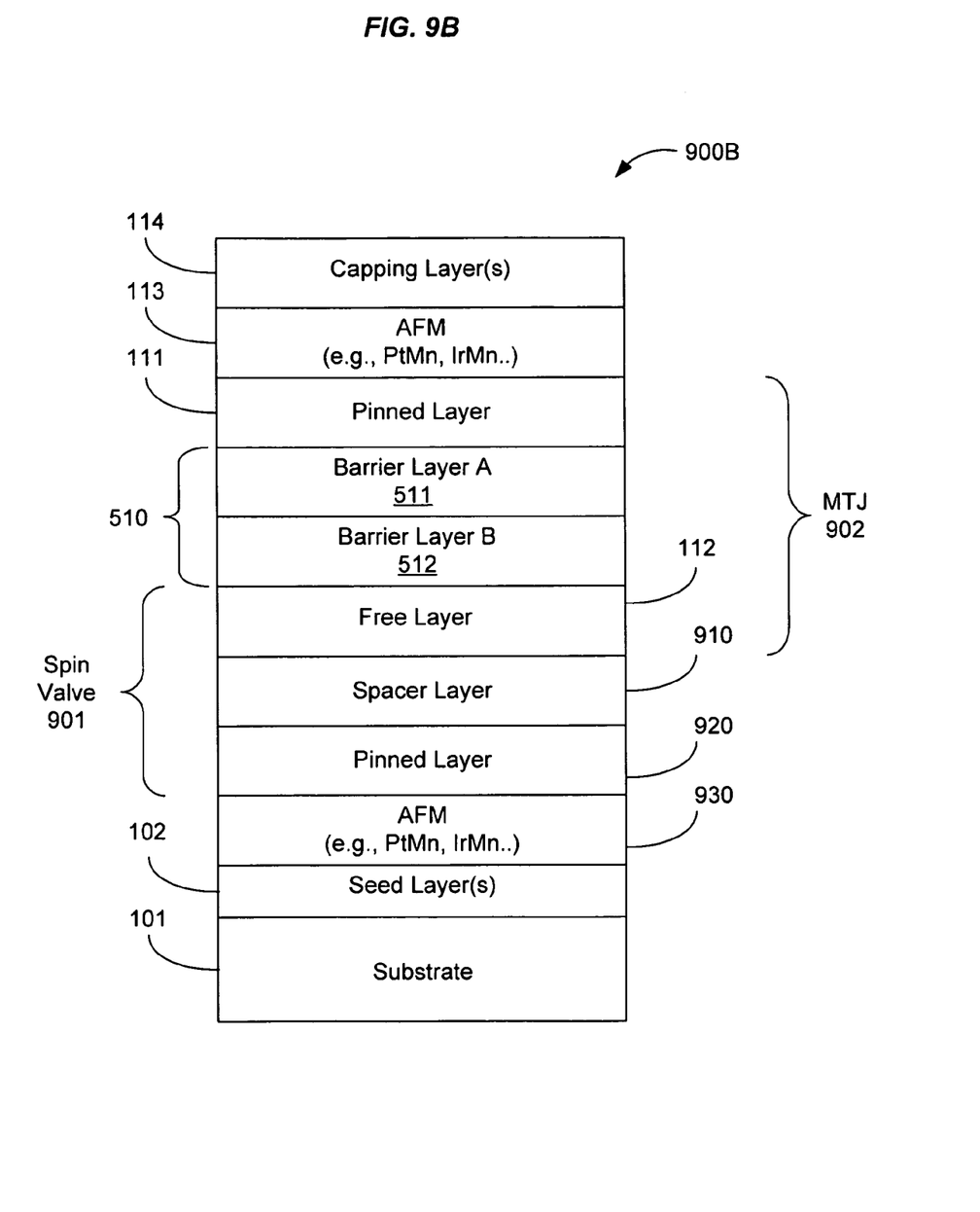
FIG. 9B shows an example of a hybrid MTJ cell structure which stacks a spin valve stacks underneath an MTJ cell in FIG. 5 with a shared free layer.

FIG. 9B shows a hybrid structure 900B which stacks a spin valve 901 underneath an MTJ 902 based on the bi-layer barrier design in FIG. 5. In comparison to the design in FIG. 9A, the design in FIG. 9B can be implemented to achieve certain advantages. For example, like the design in FIG. 8A, this design in FIG. 9B can reduce the circuitry asymmetry under the two different bias configurations. Second, this design in FIG. 9B can reduce the critical STT P-AP switching current required for write operation due to TMR or spin polarization enhancement at reversed bias direction. The second advantage is not expected in the design in FIG. 9A.

Figure 10A:
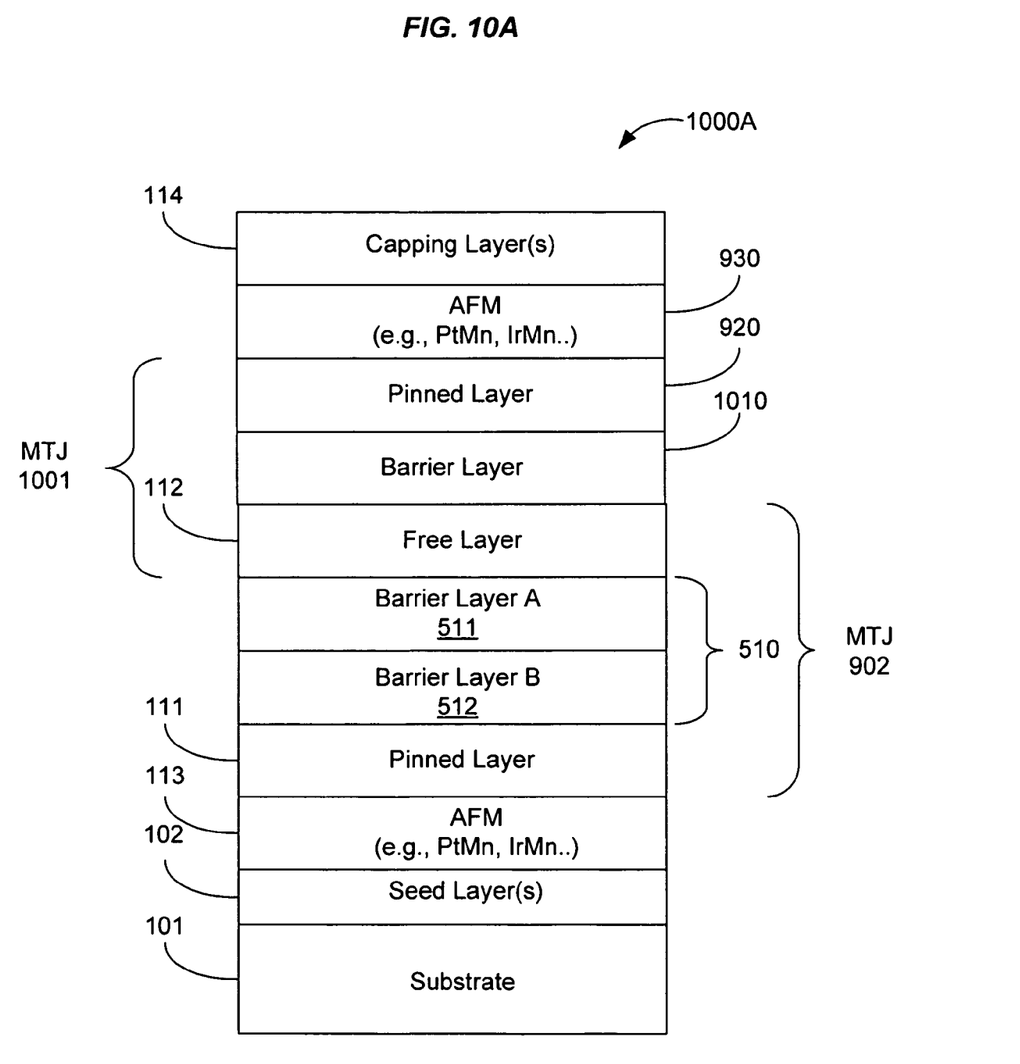
FIGS. 10A and 10B show examples of hybrid MTJ cell structures which stacks two MTJ cells together with a shared free layer and one MTJ cell has a bi-layer barrier layer in FIG. 5.
Figure 10B:
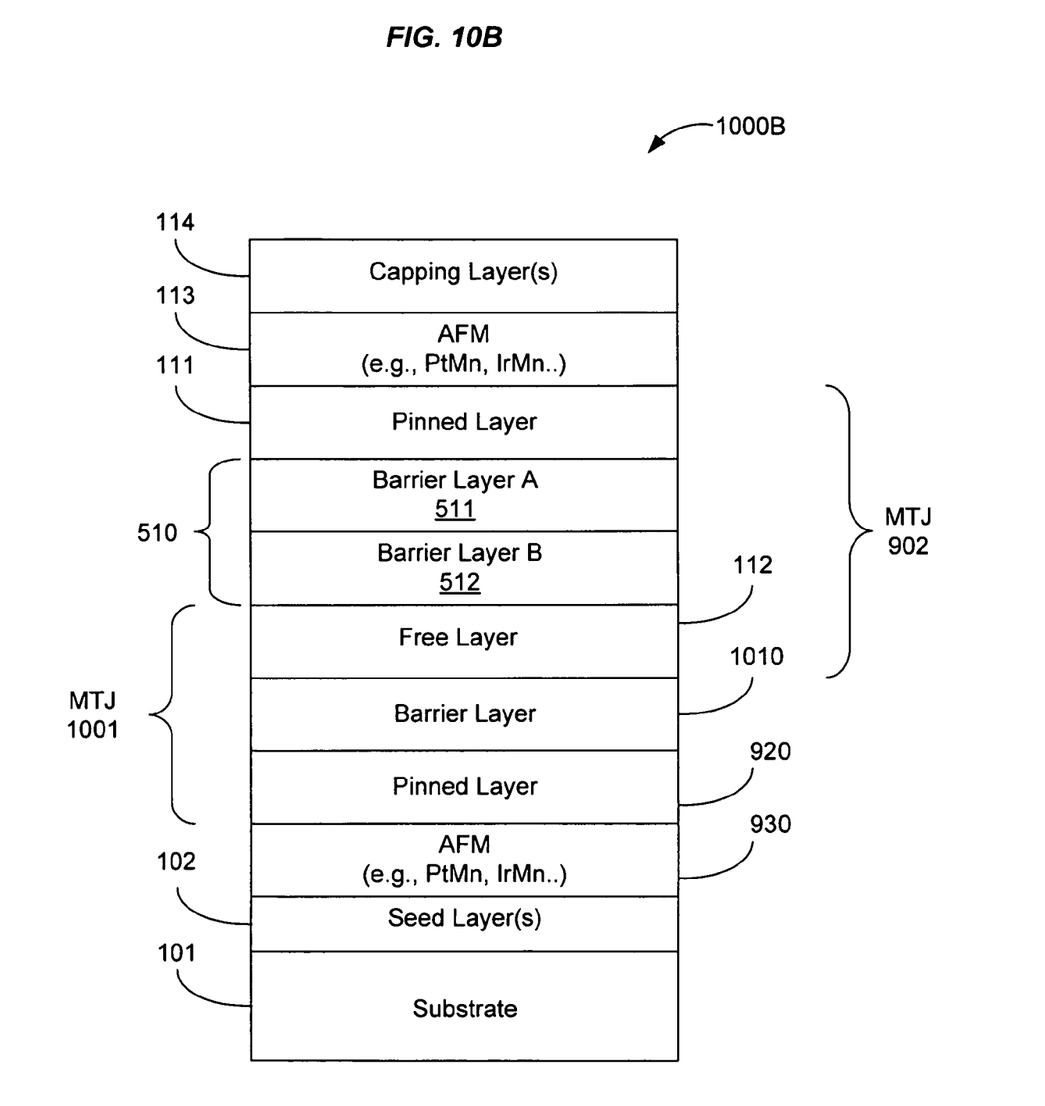

The above two hybrid structures in FIGS. 9A and 9B may be modified to effectuate two stacked MTJ cells by replacing the spacer layer 910 with an insulator barrier layer 1010 to change the spin valve 901 into a second MTJ that is stacked over the bottom MTJ. FIGS. 10A and 10B show two examples where a second MTJ 1001 replaces the spin valve in FIGS. 9A and 9B. The second MTJ 1001 shares a common free layer, the free layer 112, with the MTJ 902. This design effectuates a serial connection of two MTJ resistors. The insulator barrier layer 1010 can be made of a single-layer insulator barrier layer or a composite structure of two or more insulator barrier layers. An insulator material used in the layer 1010 can be a material used for the layers 511 or 512, or a different material. For example, the layer 1010 can include an oxide such as a porous oxide, a nitride, or a nitrioxide.

The two different insulator barrier layers 511 and 512 in FIGS. 5, 8A, 9A, 9B, 10A and 10B may be implemented in various configurations. Examples of materials for the barrier layer 512 with a large dielectric constant include AlOx, TiOx, ZnOx, ZrOx, HfOx, NbOx, ZnOx, YOx and CeOx, where x is the relative atomic weight of oxygen in each composition. Examples of materials for the insulator barrier layer 511 with a low dielectric constant include MgO and AlOx. Examples of the material composition of the bi-layer insulator barrier layer 510 include TiOx/AlOx, TiOx/MgO, AlOx/MgO, TiOx/ZrOx, TiOx/HfOx, TiOx/YOx, NbOx/AlOx, CeOx/AlOx, and CeOx/MgO. In implementations, the individual layers for the bi-barrier layer can be with thickness between 5 Å and 50 Å.

The tunneling barrier layer for each of the layers 511 and 512 in FIGS. 5, 8A, 9 and 10 can be implemented in various configurations beyond the specific examples described above. For example, one of the tunneling barrier layers 511 and 512 can be a single amorphous or crystalline layer of an insulator material and can be one or a combination of two or more of an oxide, a nitride and a nitrioxide. For example, one of the barrier layers 511 and 512 can be an oxide of one of Al, Ti, Zn, Zr, Hf, Nb, Zn, Ce, Ta, Mg. Other examples include AlO(40-70%), MgO(30-60%), AlO(40-70%)N(2-30%), AlN (30-60%) and Al(Zr, Hf, Ti, Ta)O, where the percentage in the parentheses represents the atomic percentage weight of the element in front of the parentheses. In addition to AlN, other nitrides such as TiN and TaN can be used in one of the layers 511 and 512. Alternatively, a tunneling barrier layer 511 or 512 can be a composite layer that includes two or more different insulator barrier layers, such as a multilayer of the above films with crystalline structure or with amorphous states. A barrier layer with a thickness between 5 Å and 50 Å can be processed by depositing original metal starting material and then oxidizing the deposited films using natural oxidation and/or plasma oxidation, or by rf sputtering original oxide starting material so that there is tunneling current across the barrier. The resistance-area product range of the barrier is between 10 and $100\Omega\text{-}\mu m^2$. The structure of the interfaces between the barrier and free layer as well as the barrier and the pinned layer can be optimized to achieve a large spin polarization of electrons as well as a tunneling magneto-resistance (TMR) values (e.g., TMR>20%).

Various examples for other layers in FIGS. 5, 8A, 9 and 10 are described below.

1. Free Layer

The free layers (FL) are Co, Fe, Ni or their alloys with crystalline structure or with amorphous states modified by boron or other amorphous forming elements addition at different composition (0-30 at. %). The saturation magnetization of the free layer can be adjusted between 400-1500 emu/cm$^3$ by varying the composition of amorphous forming elements. The layer thickness may be controlled so that the output signal (while optimizing current induced switching) remains at an acceptable level.

The free layer can be a single layer or a multiple layer configuration. For a single layer case, a ferromagnetic or ferrimagnetic material can be used. The individual layers of the multiple layer configurations can be either a combination of different magnetic materials, which are either ferromagnetic or ferrimagnetic, or a combination of magnetic and non-magnetic layers such as synthetic anti-ferromagnetic or synthetic ferromagnetic layers where two ferromagnetic layers are separated by a non-magnetic spacer. The spacer layer used in this synthetic structure also provides advantage of a diffusion stop layer against the possible diffusion of Mn element used in an antiferromagnetic layer into a barrier layer. A ferromagnetic layer in the free layer can include Co, CoFe(5-40%), CoFe(5-40%)B(5-30%) CoFe(5-40%)Ta(5-30%), NiFe(~15-25%), CoNiFe(5-40%), CoPt(5-40%), CoPd(5-40%), FePt(5-40%), Co$_2$Mn(Al,Si), Co$_2$(Cr,Fe) (Al, Si), CoFeB, NiFe, CoFeNiB, CoFeVB or CoFeTaB. A ferrimagnetic layer within the free layer can be CoGd(15-35%) or FeGd(10-40%). A non-magnetic spacer within the free layer can be Ru, Re or Cu. All compositions listed above are in atomic percent. Examples of multi-layer configurations for the free layer include, CoFeB/Ru/NiFe, CoFeB/Ru/CoFeNiB, CoFeB/Ru/CoFeVB, and CoFeB/Ru/CoFeTaB for improved MTJ performance.

2. Pin Layer

The pin layer (PL) can be made from Co, Fe, Ni or their alloys with a crystalline structure or with amorphous states modified by boron or other amorphous forming elements addition at different composition(0-30 at. %). The pin layer can be a single layer or a multiple layer configuration. For a single layer case, a ferromagnetic or ferrimagnetic material can be used. The individual layers of the multiple layer configurations can be either a combination of magnetic materials, which are either ferromagnetic or ferrimagnetic, or a combination of magnetic and non-magnetic layers (such as synthetic anti-ferromagnetic where two ferromagnetic layers are separated by a non-magnetic spacer). The ferromagnetic layers can be Co, CoFe(5-40%), CoFe(5-40%)B(5-30%) CoFe(5-40%)Ta(5-30%), NiFe(~20%), CoPt(5-40%), CoPd(5-40%), FePt(5-40%), Co$_2$Mn(Al, Si) or Co$_2$(Cr,Fe) (Al, Si). Ferrimagnetic layers can be CoGd(15-35%) or FeGd(10-40%). The non-magnetic spacer can be Ru, Re or Cu. All compositions are in atomic percent.

3. Spacer Layer

In a spin valve cell, the barrier layer 130 described above for MTJ cells is replaced by a non-magnetic metal spacer layer. Examples for the spacer material include Cu, Ag, Pt, Ru, Re, Rh, Ta, Ti, combinations of two or more these metals, or alloys of these metals. The non-magnetic spacer layer can be a composite nonmagnetic conductive structure with multiple layers such as one or more of the above metals in combination with a nano-oxide layer (NOL) or current confinement layer insertion. Examples of the composite nonmagnetic conductive structure as an NOL can be two metal layers with a thin layer of a nano-oxide layer in between, such as an oxide of an AlCu alloy, Ta, Ti, or a CoFe alloy between two Cu layers: Cu/AlCu/Ox/Cu, Cu/Ta/Ox/Cu, Cu/Ti/Ox/Cu, Cu/thin CoFe/Ox/Cu. In these examples, Cu can be replaced by other non-magnetic conductive metals. In some implementations, the non-magnetic spacer may be formed by first depositing original metal starting material and then oxidizing the deposited films using natural oxidation and/or plasma oxidation, or by rf sputtering an original oxide starting material. The starting metal material may use the materials similar to pin or free layer material such as magnetic material CoFe, CoFeB, and non magnetic material Al, Ta, Ru, and Ti. The current confinement layer can be, for example, Cu/CoFe, FeSi, Al, Ta, Ru or Ti/NOL/Cu.

Figure 11:
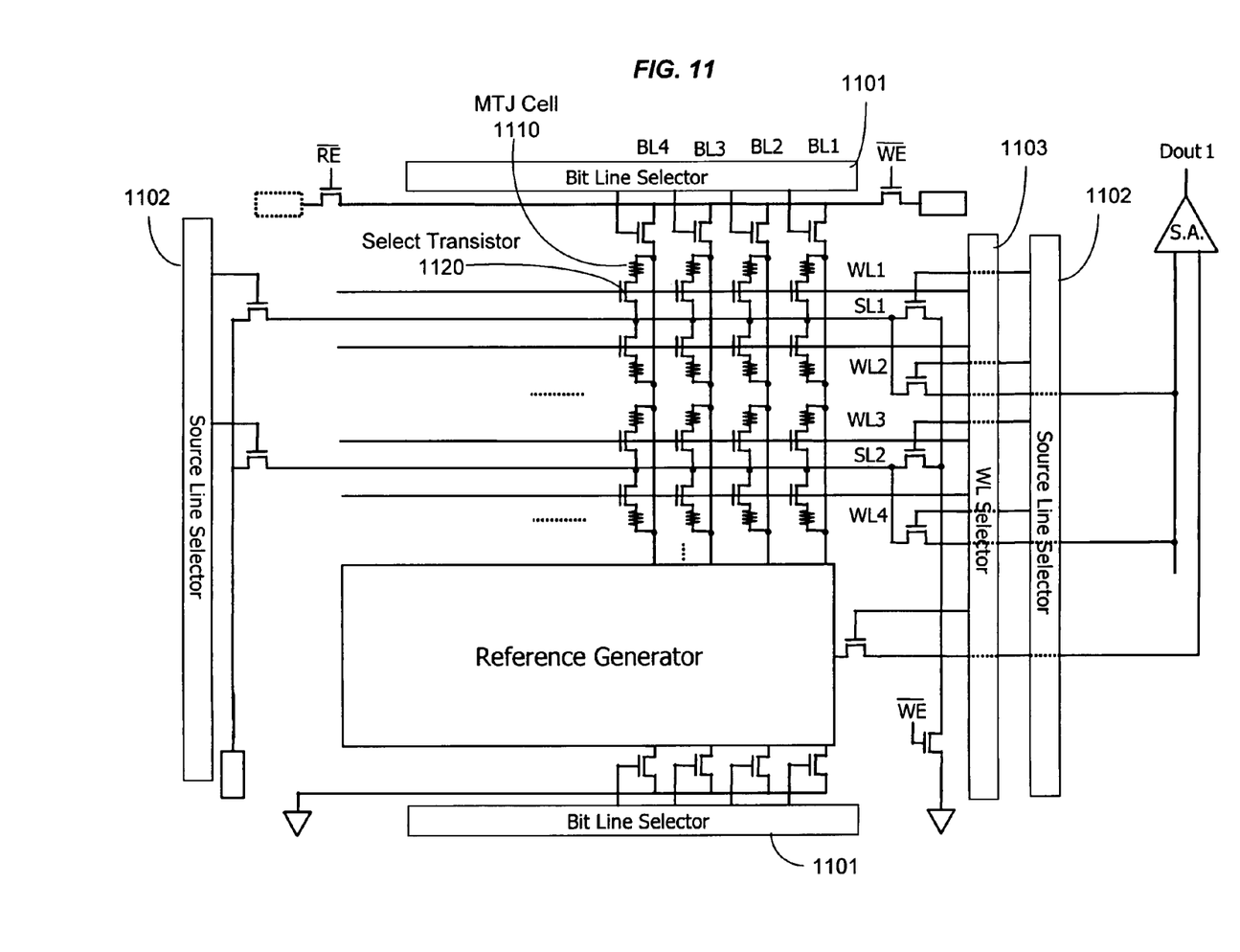
FIG. 11 shows an example of an MTJ cell array using the MTJ cell design in FIGS. 5, 8A, 9A, 9B, 10A or 10B.

FIG. 11 illustrates an exemplary MTJ cell array for an MRAM device where each MTJ cell is based on the bi-layer barrier design in FIG. 5, 8A, 9 or 10 and is operated based on the spin torque transfer (STT) switching. The bi-barrier MTJ cells 1110 can be arranged and connected in an array in a common way without special requirement for the bit/source lines. The footprint of the bi-barrier MTJ cell 1110 is as usual so that array efficiency is not affected at all. Each MTJ cell 1110 is connected in series to a select transistor 1120 in a unit cell of the array. While reading the memory cells, the circuit is designed in a similar way for conventional MTJ cells. There is no additional resistor load that may cause data access delay. As illustrated bit line selector 1101, source line selector 1102 and word line selector 1103 are coupled to the cell array to control the operations of each cell.

While this specification contains many specifics, these should not be construed as limitations on the scope of any invention or of what may be claimed, but rather as descriptions of features specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Thus, particular embodiments have been described. Other embodiments are within the scope of the following claims.

What is claimed is:

1. A device comprising:
    a magnetoresistive tunnel junction (MTJ) which comprises:
    a free ferromagnetic layer having a magnetization direction that is changeable;
    a pinned ferromagnetic layer having a magnetization direction fixed along a predetermined direction; and
    an insulator barrier structure formed between the free and pinned ferromagnetic layers and configured to comprise at least first and second insulator barrier layers that have different dielectric constants,
    wherein both the first and the second insulator barrier layers are made of amorphous materials.

2. The device as in claim 1, wherein the insulator barrier structure has a multilayer structure which comprises more than two insulator barrier layers.

3. The device as in claim 1, wherein at least one of the first and the second insulator barrier layers comprises a composite layer that comprises at least two different insulator barrier layers.

4. The device as in claim 1, wherein either of the first and second insulator barrier layers has a thickness between 5 Å and 50 Å.

5. The device as in claim 1, wherein the free ferromagnetic layer comprises a non-magnetic middle layer, a first ferromagnetic layer on one side of the non-magnetic middle layer and a second ferromagnetic layer on an opposite side of the non-magnetic middle layer.

6. The device as in claim 1, further comprising:
a transistor electrically connected to the MTJ in series to supply a current to the MTJ to switch the magnetization of the free ferromagnetic layer.

7. The device as in claim 6, further comprising:
a plurality of MTJs similarly constructed as the MTJ to form an MTJ array with the MTJ; and
a plurality of transistors, each electrically connected to a respective one of the plurality of MTJs in series to supply a current to the respective MTJ to switch the magnetization of the free ferromagnetic layer.

8. The device as in claim 1, wherein at least one of the first and the second insulator barrier layers comprises at least one of an oxide, a nitride and a nitridoxide.

9. The device as in claim 8, wherein at least one of the first and the second insulator layers comprises an oxide of Al, Ti, Zn, Zr, Hf, Nb, Zn, Ce, Ta and Mg.

10. The device as in claim 8, wherein at least one of the first and the second insulator layers comprises AlN, TiN, or TaN.

11. The device as in claim 1, further comprising:
a substrate on which the MTJ is formed;
wherein the pinned ferromagnetic layer is formed above the substrate and below the first and second insulator barrier layers, and the free ferromagnetic layer,
wherein the first insulator barrier layer is adjacent to the free ferromagnetic layer and the second insulator barrier layer is adjacent to the pinned ferromagnetic layer, and
wherein the first insulator barrier layer has a smaller dielectric constant than the second insulator barrier layer.

12. The device as in claim 11, further comprising:
a spacer layer, which is non-magnetic and electrically conductive, formed on top of the free ferromagnetic layer; and
a second pinned ferromagnetic layer formed on top of the spacer layer to construct a spin valve with the spacer layer and the free ferromagnetic layer.

13. The device as in claim 11, further comprising:
a third insulator barrier layer formed on top of the free ferromagnetic layer; and
a second pinned ferromagnetic layer formed on top of the third insulator barrier layer to construct a second MTJ with the third insulator barrier layer and the free ferromagnetic layer.

14. The device as in claim 13, wherein the third insulator barrier layer includes a material used for one of the first and second insulator barrier layers.

15. The device as in claim 13, wherein a material of the third insulator barrier layer includes an oxide, a nitride, or a nitrioxide.

16. The device as in claim 1, further comprising:
a substrate on which the MTJ is formed;
wherein the free ferromagnetic layer is formed above the substrate and below the first and second insulator barrier layers, and the pinned ferromagnetic layer,
wherein the first insulator barrier layer is adjacent to the pinned ferromagnetic layer and the second insulator barrier layer is adjacent to the free ferromagnetic layer, and
wherein the first insulator barrier layer has a smaller dielectric constant than the second insulator barrier layer.

17. The device as in claim 16, further comprising:
a third insulator barrier layer formed above the substrate and below the free ferromagnetic layer; and
a second pinned ferromagnetic layer formed above the substrate and below the third insulator barrier layer to construct a second MTJ with the third insulator barrier layer and the free ferromagnetic layer.

18. The device as in claim 17, wherein the third insulator barrier layer includes a material used for one of the first and second insulator barrier layers.

19. The device as in claim 17, wherein a material of the third insulator barrier layer includes an oxide, a nitride, or a nitrioxide.

20. The device as in claim 16, further comprising:
a spacer layer, which is non-magnetic and electrically conductive, formed above the substrate and below the MTJ; and
a second pinned ferromagnetic layer formed above the substrate and below the spacer layer to construct a spin valve with the spacer layer and the free ferromagnetic layer.

21. The device as in claim 20, wherein the spacer layer comprises two nonmagnetic metal layers and an oxide layer between the two nonmagnetic metal layers.

22. The device as in claim 21, wherein one of the two nonmagnetic metal layers comprises at least one of or an alloy of Cu, Ag, Pt, Ru, Re, Rh, Ta and Ti.

23. A device comprising:
a magnetoresistive tunnel junction (MTJ) which comprises:
a free ferromagnetic layer having a magnetization direction that is changeable;
a pinned ferromagnetic layer having a magnetization direction fixed along a predetermined direction; and
an insulator barrier structure formed between the free and pinned ferromagnetic layers and configured to comprise at least first and second insulator barrier layers that have different dielectric constants,
wherein both the first and the second insulator barrier layers are made of crystalline materials.

24. The device as in claim 23, wherein the insulator barrier structure has a multilayer structure which comprises more than two insulator barrier layers.

25. The device as in claim 23, wherein at least one of the first and the second insulator barrier layers comprises a composite layer that comprises at least two different insulator barrier layers.

26. The device as in claim 23, wherein either of the first and second insulator barrier layers has a thickness between 5 Å and 50 Å.

27. The device as in claim 23, wherein the free ferromagnetic layer comprises a non-magnetic middle layer, a first ferromagnetic layer on one side of the non-magnetic middle layer and second ferromagnetic layer on an opposite side of the non-magnetic middle layer.

28. The device as in claim 23, further comprising:
a transistor electrically connected to the MTJ in series to supply a current to the MTJ to switch the magnetization of the free ferromagnetic layer.

29. The device as in claim 28, further comprising:
a plurality of MTJs similarly constructed as the MTJ to form an MTJ array with the MTJ; and
a plurality of transistors, each electrically connected to a respective one of the plurality of MTJs in series to supply a current to the respective MTJ to switch the magnetization of the free ferromagnetic layer.

30. The device as in claim 23, wherein at least one of the first and the second insulator barrier layers comprises at least one of an oxide, a nitride and a nitridoxide.

31. The device as in claim 30, wherein at least one of the first and the second insulator layers comprises an oxide of Al, Ti, Zn, Zr, Hf, Nb, Zn, Ce, Ta and Mg.

32. The device as in claim 30, wherein at least one of the first and the second insulator layers comprises AlN, TiN, or TaN.

33. The device as in claim 23, further comprising:
a substrate on which the MTJ is formed;
wherein the pinned ferromagnetic layer is formed above the substrate and below the first and second insulator barrier layers, and the free ferromagnetic layer,
wherein the first insulator barrier layer is adjacent to the free ferromagnetic layer and the second insulator barrier layer is adjacent to the pinned ferromagnetic layer, and
wherein the first insulator barrier layer has a smaller dielectric constant than the second insulator barrier layer.

34. The device as in claim 33, further comprising:
a spacer layer, which is non-magnetic and electrically conductive, formed on top of the free ferromagnetic layer; and
a second pinned ferromagnetic layer formed on top of the spacer layer to construct a spin valve with the spacer layer and the free ferromagnetic layer.

35. The device as in claim 33, further comprising:
a third insulator barrier layer formed on top of the free ferromagnetic layer; and
a second pinned ferromagnetic layer formed on top of a spacer layer to construct a second MTJ with the third insulator barrier layer and the free ferromagnetic layer.

36. The device as in claim 35, wherein the third insulator barrier layer includes a material used for one of the first and second insulator barrier layers.

37. The device as in claim 35, wherein a material of the third insulator barrier layer includes an oxide, a nitride, or a nitrioxide.

38. The device as in claim 23, further comprising:
a substrate on which the MTJ is formed;
wherein the free ferromagnetic layer is formed above the substrate and below the first and second insulator barrier layers, and the pinned ferromagnetic layer,
wherein the first insulator barrier layer is adjacent to the pinned ferromagnetic layer and the second insulator barrier layer is adjacent to the free ferromagnetic layer, and
wherein the first insulator barrier layer has a smaller dielectric constant than the second insulator barrier layer.

39. The device as in claim 38, further comprising:
a third insulator barrier layer formed above the substrate and below the free ferromagnetic layer; and
a second pinned ferromagnetic layer formed above the substrate and below the third insulator barrier layer to construct a second MTJ with the third insulator barrier layer and the free ferromagnetic layer.

40. The device as in claim 39, wherein the third insulator barrier layer includes a material used for one of the first and second insulator barrier layers.

41. The device as in claim 39, wherein a material of the third insulator barrier layer includes an oxide, a nitride, or a nitrioxide.

42. The device as in claim 38, further comprising:
a spacer layer, which is non-magnetic and electrically conductive, formed above the substrate and below the MTJ; and
a second pinned ferromagnetic layer formed above the substrate and below the spacer layer to construct a spin valve with the spacer layer and the free ferromagnetic layer.

43. The device as in claim 42, wherein the spacer layer comprises two nonmagnetic metal layers and an oxide layer between the two nonmagnetic metal layers.

44. The device as in claim 43, wherein one of the two nonmagnetic metal layers comprises at least one of or an alloy of Cu, Ag, Pt, Ru, Re, Rh, Ta and Ti.

* * * * *